United States Patent
Hirose (10) Patent No.: US 8,710,835 B2
(45) Date of Patent: Apr. 29, 2014

(54) MAGNETIC IMPEDANCE ELEMENT AND MAGNETIC SENSOR USING THE SAME

(75) Inventor: Sakyo Hirose, Nagaokakyo (JP)

(73) Assignee: Murata Manufacturing Co., Ltd., Nagaokakyo-shi, Kyoto-Fu (JP)

(*) Notice: Subject to any disclaimer, the term of this patent is extended or adjusted under 35 U.S.C. 154(b) by 217 days.

(21) Appl. No.: 13/232,359

(22) Filed: Sep. 14, 2011

(65) Prior Publication Data

US 2012/0001626 A1    Jan. 5, 2012

Related U.S. Application Data

(63) Continuation of application No. PCT/JP2010/054588, filed on Mar. 17, 2010.

(30) Foreign Application Priority Data

Mar. 19, 2009   (JP) .................................. 2009-067814

(51) Int. Cl.
    *G01R 33/02*    (2006.01)
(52) U.S. Cl.
    USPC .......................................... 324/249; 324/252
(58) Field of Classification Search
    USPC .................. 324/252–253, 260, 249
    See application file for complete search history.

(56) References Cited

U.S. PATENT DOCUMENTS

| 7,785,662 | B2 | 8/2010 | Fuji et al. |
| 2004/0057897 | A1* | 3/2004 | Cheong et al. ............. 423/594.2 |

FOREIGN PATENT DOCUMENTS

| JP | 10-022129 A | 1/1998 |
| JP | 10-233541 A | 9/1998 |
| JP | 11-109006 A | 4/1999 |
| JP | 11-284249 A | 10/1999 |
| JP | 2000-174359 A | 6/2000 |
| JP | 2003-173908 A | 6/2003 |
| JP | 2005-062000 A | 3/2005 |
| JP | 2006-286713 A | 10/2006 |
| JP | 2007-027493 A | 2/2007 |
| JP | 2007-115960 A | 5/2007 |

OTHER PUBLICATIONS

Kobayashi, K.I., et al.; "Room-temperature magnetoresistance in an oxide material with an ordered double-perovskite structure;" Nature; Oct. 15, 1998; vol. 395; pp. 677-680.

Written Opinion of the International Searching Authoirty, mailed Jun. 22, 2010.

* cited by examiner

*Primary Examiner* — Jay Patidar (74) *Attorney, Agent, or Firm* — Dickstein Shapiro LLP (57) ABSTRACT

In order to provide a magnetic impedance element capable of achieving a large magnetic impedance effect at room temperature or higher, the magnetic impedance element includes a ceramic body represented by the chemical formula $Sr_{2-x}Ba_xFe_yMo_zO_6$ ($0.8 \leq x \leq 2.0$, $y+z=2$), and at least two electrode terminals are provided on the ceramic body.

20 Claims, 6 Drawing Sheets

Magnetic impedance characteristics of sample number 1

FIG 4

Magnetic impedance characteristics of sample number 1

FIG 5

Magnetic impedance characteristics of sample number 9

FIG 6

Magnetic impedance effect at 500 G for samples (30 pieces) with or without through conductor

Fig 7

Changes in rate of MI change in the case of changing magnetic field
ceramic composition: No. 7 (27)

MAGNETIC IMPEDANCE ELEMENT AND MAGNETIC SENSOR USING THE SAME

This is a continuation of application Serial No. PCT/JP2010/054588, filed Mar. 17, 2010, the entire contents of which is incorporated herein by reference.

TECHNICAL FIELD

The present invention relates to a magnetic impedance element and a magnetic sensor using the same, and more particularly, relates to a magnetic impedance element including strontium, barium, iron, and molybdenum, and a magnetic sensor using the same.

BACKGROUND ART

Elements capable of sensing magnetic fields are disclosed in, for example, Japanese Patent Application Laid-Open No. 11-284249 (Patent Document 1), Japanese Patent Application Laid-Open No. 11-109006 (Patent Document 2), and Japanese Patent Application Laid-Open No. 2000-174359 (Patent Document 3).

PRIOR ART DOCUMENTS

Patent Documents

Patent Document 1: Japanese Patent Application Laid-Open No. 11-284249
Patent Document 2: Japanese Patent Application Laid-Open No. 11-109006
Patent Document 3: Japanese Patent Application Laid-Open No. 2000-174359

DISCLOSURE OF THE INVENTION

Problem to be Solved by the Invention

Patent Document 1 discloses a magnetoresistive element composed of a material which has an ordered double perovskite type crystal structure represented by the general formula $A_2BB'O_6$, in which the A atom occupying the A site is Sr, the B atom and B' atom occupying the B site are Fe and Mo, and moreover, the Fe and Mo atoms alternately occupy the B site, and which is a crystalline oxide body exhibiting negative magnetoresistive characteristics. In addition, Patent Document 1 discloses, a magnetoresistive element composed of a material which has an ordered double perovskite structure, in which the degree of order is 20% or more for the Mo atom and Fe atom in the B site.

The foregoing element has the problem of the need for a high magnetic field around room temperature or higher because of a small rate of change in spite of having high ferromagnetic transition temperature, while a very large rate of change in magnetic resistance is achieved at low temperature.

Patent Document 2 is aimed at providing a high-sensitivity magnetic sensor which is small in size and low in cost, and excellent in terms of linearity and temperature characteristics of the output from a detected magnetic field, and provides a magnetic sensor which has a structure including a bias coil and a negative feedback coil wrapped around a thin film magnetic core with an insulator layer interposed therebetween, and this structure allows magnetic sensors to be reduced in size and mass-produced. The two thin film coils increase the efficiency, thus achieving a required bias magnetic field with a low current, and allowing the linearity of output to a magnetic field to be improved with a small amount of negative feedback.

The thin film magnetic core is formed from a plating film of NiFe or CoFeNi, an amorphous sputtered film of CoZrNb, FeSiB, or CoSiB, or a sputtered film of NiFe.

While the device of Patent Document 2 is quite responsivity to lower magnetic fields, it has a limited range of use because it has a narrow range of sensing magnetic fields, and exhibits positive changes in impedance in lower magnetic fields while exhibiting negative changes in impedance in higher magnetic fields.

Patent Document 3 discloses a tunneling magnetoresistance (TMR) element using Sr, Ba, Fe, and Mo oxides.

However, Patent Document 3 element has a problem of a narrow range of sensing and works only at low temperature and in a low magnetic field.

The use of a colossal magnetoresistance (CMR) material can achieve a larger change in magnetic resistance than before, but its operating temperature is limited to low temperatures, and it requires a strong magnetic field on the order of several T in order to provide a significant change, and as a result, the sensor is thus not able to be used as a sensor for sensing actual service temperature and magnetic field. In addition, TMR (tunneling magnetoresistance), AMR (anisotropicmagnetoresistance), GMR (giant magnetoresistance), and MI (magnetoimpedance) devices which have been already put into use as magnetic sensors responsive to low magnetic fields use metal ferromagnets or semiconductors, rather than oxides. While the sensors are responsive to quite low magnetic fields, the sensors have the problem of a narrow magnetic field detection range, and also have problems such as being saturated instantly by a strong magnetic field to cause hysteresis. Magnetic sensor devices have been desired which operate from lower magnetic fields to relatively higher magnetic fields.

Therefore, the present invention has been achieved in order to solve the problems as described above, and an object of the present invention is to provide a magnetic impedance element which has a wide operating range, and a magnetic sensor using the same.

Means for Solving the Problem

A magnetic impedance element according to the present invention includes a ceramic body represented by the chemical formula $Sr_{2-x}Ba_xFe_yMo_zO_6$ ($0.8 \leq x \leq 2.0$, $y+z=2$), and at least two external electrode terminals provided on the ceramic body.

The thus configured magnetic impedance element achieves a high rate of change in magnetic impedance at room temperature or higher.

Preferably, the ceramic body satisfies $0.8 \leq x \leq 1.7$. Preferably, the ceramic body is represented by the chemical formula $Sr_{2-x}Ba_xFe_yMo_zO_6$ ($0.8 \leq x \leq 1.7$, $y+z=2$, $0.9 \leq y/z \leq 1.1$).

Preferably, the larger of the ratio (L/T) of length L to thickness T and the ratio (L/W) of length L to width W is 1.5 or more in the ceramic body.

In this case, better responsivity to lower magnetic fields can be achieved, and variations can be reduced.

Preferably, the magnetic impedance element further includes a conductor for causing short circuit between the external electrode terminals.

Preferably, the magnetic sensor according to the present invention uses any of the magnetic impedance elements described above.

A ceramic material composition of the chemical formula $Sr_{2-x}Ba_xFe_yMo_zO_6$ ($0.8 \leq x \leq 2.0$, $y+z=2$) allows a high rate of change in magnetic impedance (MI) of 20% or more to be achieved in a magnetic field of 500 G (0.05 T). Furthermore, the composition allows a high rate of MI change of 20% in a magnetic field of 500 G while having Tc higher than 85° C. which is the guaranteed temperature for electric components used for cellular phones, etc.

Furthermore, the device structure (L/T, L/W) can reduce the demagnetization field component to improve response characteristics in lower magnetic fields, and furthermore, the formation of a through conductor allows the capacitance component to be reduced, thereby achieving an improvement in rate of MI change and a reduction in variation.

BEST MODE FOR CARRYING OUT THE INVENTION

Embodiments of the present invention will be described below with reference to the drawings. It is to be noted that the same descriptions will be applied to the same or corresponding parts in embodiments below, and the descriptions of the parts will not repeated.

Embodiment 1

Figure 1:
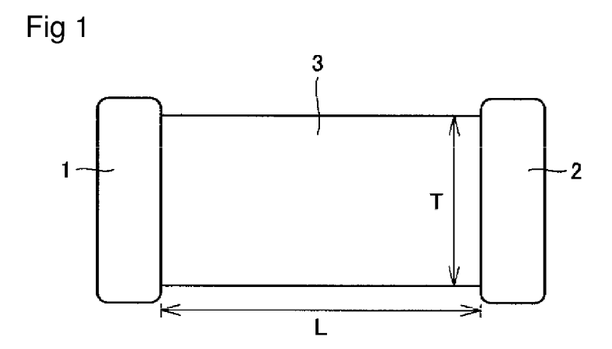
FIG. 1 is a cross-sectional view of a magnetic impedance element according to Embodiment 1 of the present invention.

FIG. 1 is a cross-sectional view of a magnetic impedance element according to Embodiment 1 of the present invention. Referring to FIG. 1, the magnetic impedance element according to Embodiment 1 of the present invention includes a ceramic body 3 and terminal electrodes 1 and 2 provided on both sides of the ceramic body 3. The ceramic of body 3 is represented by the chemical formula $Sr_{2-x}Ba_xFe_yMo_zO_6$ ($0.8 \leq x \leq 2.0$, preferably $0.8 \leq x \leq 1.7$, and $0.9 \leq y/z \leq 1.1$, $y+z=2$).

In addition, the larger of the ratio L/T of the distance between the terminal electrodes 1 and 2 (the length of the ceramic body 3) L to the thickness T of the ceramic body 3 and the ratio L/W of the length L to the width W (not shown in FIG. 1) in a direction perpendicular to the thickness and the length is desirably 1.5 or more.

Embodiment 2

Figure 2:
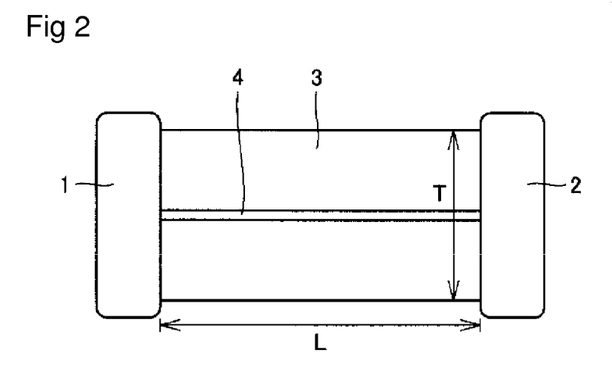
FIG. 2 is a cross-sectional view of a magnetic impedance element according to Embodiment 2 of the present invention.

FIG. 2 is a cross-sectional view of a magnetic impedance element according to Embodiment 2 of the present invention. The magnetic impedance element according to Embodiment 2 of the present invention differs from the magnetic impedance element according to Embodiment 1 in that a through conductor 4 is provided between electrode terminals 1 and 2. As shown in FIG. 2, the magnetic impedance element according to Embodiment 2 has the through conductor 4 between the electrode terminals 1 and 2, thus allowing the capacitance between the electrode terminals 1 and 2 to be reduced, and thus allowing the capacitance component to be reduced.

Example 1

A ceramic material was prepared by a solid-phase reaction method, and a magnetic impedance (MI) element was prepared by a common sheet lamination method.

For the ceramic material, barium carbonate ($BaCO_3$), strontium carbonate ($SrCO_3$), iron oxide ($Fe_2O_3$), and molybdenum oxide ($MoO_6$) were used as starting raw materials, weighed to provide desired compositions after firing, and put along with PSZ balls, ethanol, and a dispersant into a pot to carry out grinding and mixing for 24 hours. After the grinding and mixing, the ethanol was evaporated with the use of hot water at a temperature of 80° C. to obtain dried powders. Then, calcination was carried out at a temperature of 800° C. for 4 hours in the atmosphere to obtain raw materials for sheet forming. At this stage, a single phase $(Sr,Ba)_2(Fe,Mo)_2O_6$ has not been formed.

Next, a method for manufacturing an evaluation device will be described. The sheet raw material powder, a binder, a plasticizer, ethanol, toluene, and a dispersant were blended along with PSZ (partially stabilized zirconia) balls in a pot, and subjected to grinding and mixing to prepare a slurry for sheet forming. The slurry was formed by a doctor blade method into green sheets of approximately 50 μm in thickness, and the sheets were then cut into a predetermined size.

The green sheets were stacked and subjected to a pressure bonding treatment so as to have a predetermined shape, and cut so as to have a predetermined size, thereby forming a green chip. In the case of providing a through conductor inside, a Pd conductor paste was applied by screen printing onto the cut green sheet, and the dried green sheet with the Pd conductor paste thereon was then inserted into a stack of sheets.

Then, the green chip was subjected to a binder removal treatment in the atmosphere at a temperature of 400 to 450° C., and to firing for 12 hours in a $N_2$—$H_2O$—$H_2$ atmosphere at a temperature of 1100 to 1250° C. to obtain a ceramic body formed of $(Sr,Ba)_2(Fe,Mo)_2O_6$. Then, a Ag-based external electrode precursor was applied and formed in the L direction, and subjected to a firing treatment in a $N_2$—$H_2$ atmosphere at a temperature of 700° C. to prepare a sample for evaluation. FIG. 1 shows the sample prepared by this method. This example provided two-terminal element with no through conductor inserted, which had element dimensions of L: 2.0 mm, W: 1.2 mm, and T: 0.8 mm (L/T=2.5).

Next, a characteristics test method will be described which was carried out for examining the effects of samples in accordance with the example of the present invention. Impedance characteristics without any magnetic field and in magnetic fields were measured with the use of an impedance analyzer (HP4294A) and an electromagnet. It is to be noted that the measurements were carried out with a magnetic field applied parallel to the L direction in which the two terminals were formed. Table 1 shows the compositions of the samples prepared.

TABLE 1

| Sample Number | Composition and value of x $Sr_{2-x}Ba_xFeMoO_6$ | Rate of Change in Magnetic Impedance (%) at 1000 G | at 500 G | Ferromagnetic Transition Temperature Tc (° C.) |
|---|---|---|---|---|
| *1 | 0 | 78 | 0 | 151 |
| *2 | 0.5 | 80 | 0 | — |
| 3 | 0.8 | 78 | 8 | 140 |
| 4 | 1 | 84 | 25 | 132 |
| 5 | 1.2 | 85 | 24 | 125 |
| 6 | 1.4 | 80 | 21 | 111 |
| 7 | 1.5 | 81 | 22 | 109 |
| 8 | 1.6 | 85 | 26 | 102 |
| 9 | 1.7 | 88 | 33 | 89 |
| 10 | 1.8 | 80 | 34 | 81 |
| 11 | 1.9 | 81 | 41 | — |
| 12 | 2 | 91 | 45 | 74 |

Samples 1 to 12 listed in Table 1 satisfy y=z=1.0. The impedance characteristics of sample 1 in Table 1 without any magnetic field, at 1000 G, and at 500 G are representatively shown in FIGS. 3 and 4. The term "initial" in FIGS. 3 and 4 indicates the case without any magnetic field.

Figure 3:
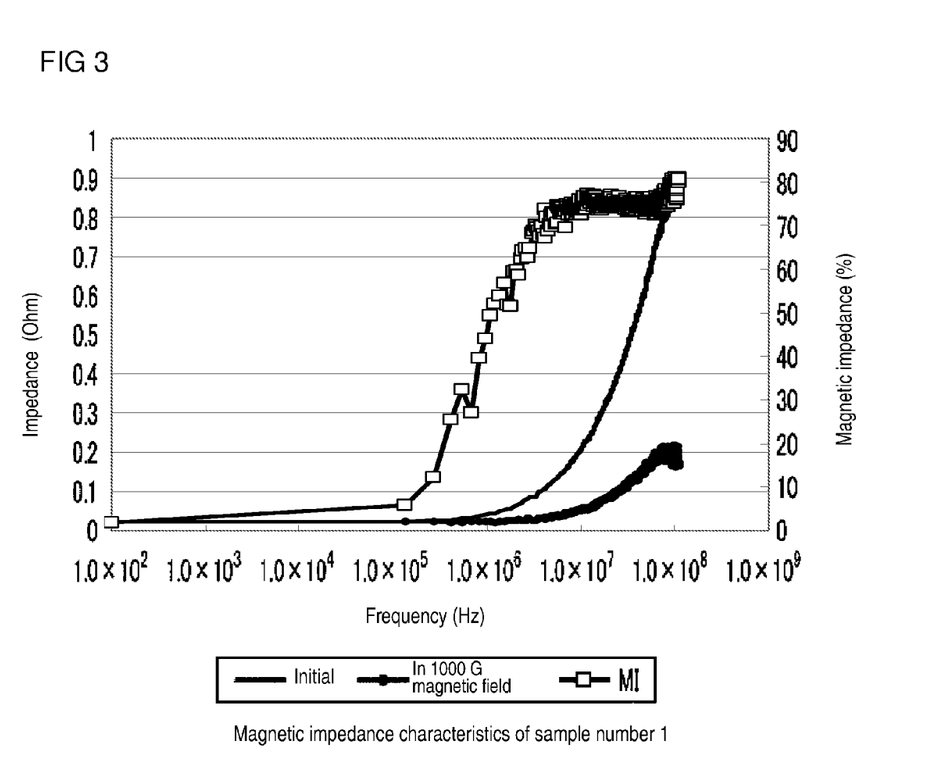
FIG. 3 is a graph showing impedance characteristics for sample number 1 in a magnetic field of 1000 G.
Figure 4:
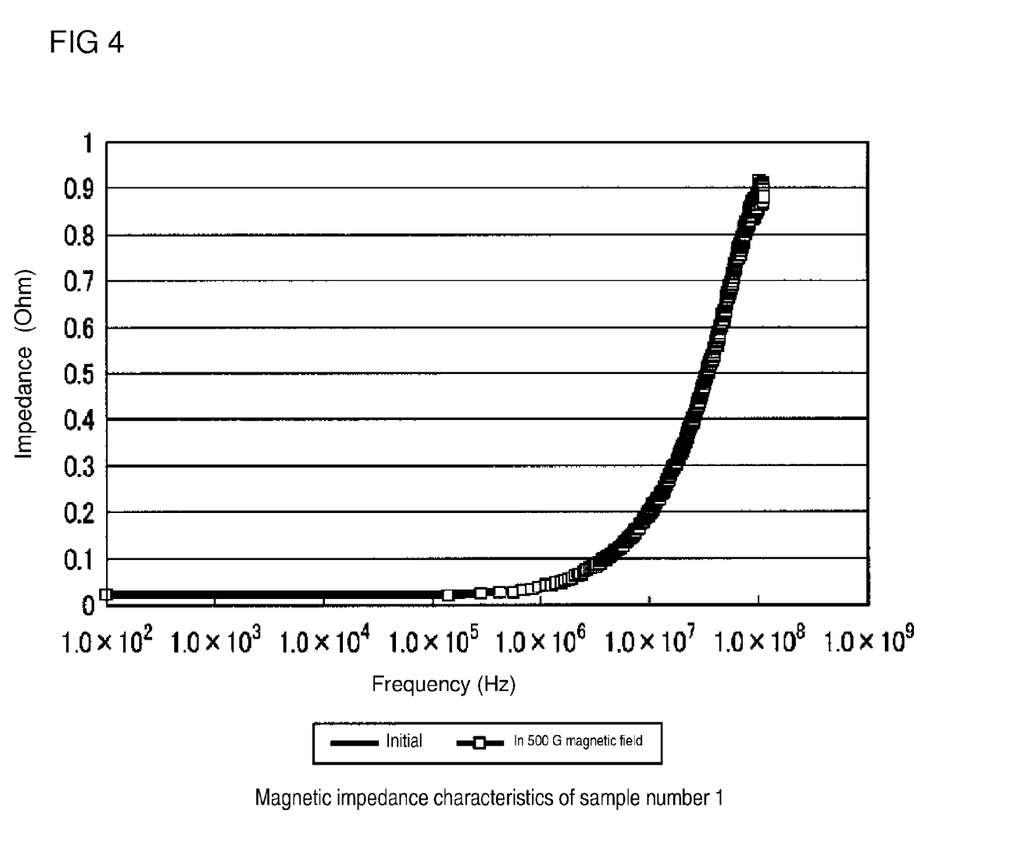
FIG. 4 is a graph showing impedance characteristics for sample number 1 in a magnetic field of 500 G.

For all of the prepared samples, the impedance was low at lower frequencies, and increased at higher frequencies in the case without any magnetic field, as shown in FIG. 3. The samples exhibited impedance characteristics typical of ferromagnetic metal materials. When a magnetic field is applied in longitudinal directions of the elements, the impedance is decreased at higher frequencies, with the result that the rate of change in the impedance reached approximately 80% (1000 G) in the case of the element of sample number 1, thereby allowing an extremely high rate of change to be achieved in a low magnetic field. For comparison, the impedance will undergo very little change even if a magnetic field is applied in a direction perpendicular to the longitudinal direction. In this example, the rates of change in magnetic impedance in two types of magnetic fields of 1000 G and 500 G were calculated in accordance with the formula below, and the samples were determined as good when the rate of change in a magnetic field of 500 G was greater than 0%, whereas the samples were determined as not good when the rate of change in a magnetic field of 500 G was 0% even if there was a high rate of change of 20% or more in a magnetic field of 1000 G.

Rate of Change in Magnetic Impedance (MI) (%)=
(Impedance (without magnetic field)−Impedance (in magnetic field))/Impedance (without magnetic field)×100

In order to examine the ferromagnetic transition temperature (Tc), a VSM (Vibrating Sample Magnetometer) was used to roughly estimate the Tc from the temperature dependence of magnetic susceptibility.

Table 1 shows the compositions and the results of the characteristic tests for the prepared samples.

As is clear from Table 1, sample number 1 of formula $Sr_2FeMoO_6$ which has a high Tc can achieve a high rate of MI change reaching 78% in a relatively high magnetic field of 1000 G, but provides almost 0 for the rate of change in a magnetic field of 500 G (see FIG. 4), and thus has a problem of responsiveness to the low magnetic field. When the Sr site is substituted with Ba, the rate of MI change in a magnetic field of 500 G is improved swiftly at Sr:Ba of 1.2:0.8, thus allowing the achievement of a high rate of change of 8% or more. Accordingly, when the ceramic composition is represented by the chemical formula $Sr_{2-x}Ba_xFeMoO_6$, a rate of MI change of 70% or more in a magnetic field of 1000 G and a rate of MI change of 8% or more in a magnetic field of 500 G can be achieved in a range of 0.8≤x≤2.0. In the table, the symbol "*" indicates a comparative example.

Figure 5:
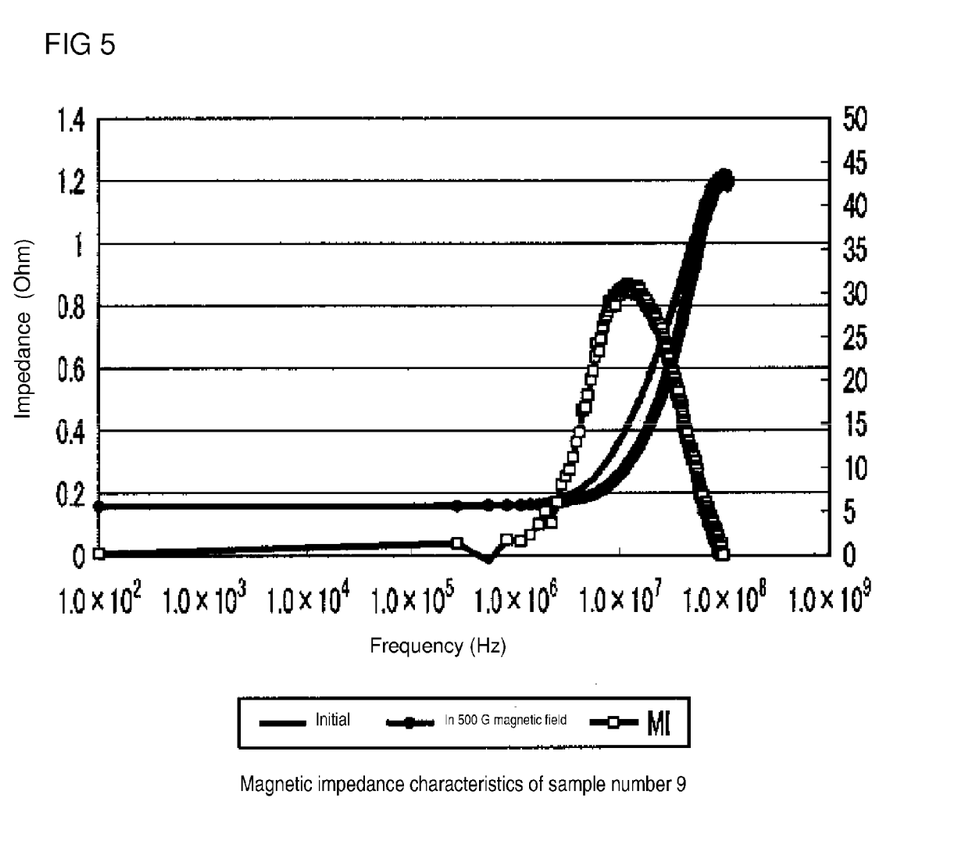
FIG. 5 is a graph showing impedance characteristics for sample number 9 in a magnetic field of 500 G.

For reference, FIG. 5 shows magnetic impedance characteristics for sample number 9.

In recent years, since magnetic sensors have been required to be guaranteed to operate not only around room temperature but also at a temperature of +85° C., the ferromagnetic transition temperature (Tc) is also desired to be +85° C. or higher. Therefore, Table 1 shows that a range of 0.8≤x≤1.7 is preferable.

Next, an examination was carried out on the influence of the Fe/Mo ratio (y/z) in a composition where x≤1.7 with the ferromagnetic transition temperature (Tc) higher than 85° C. The results of the characteristic tests are shown in Table 2. Where a sample corresponds to a sample in Table 1, that fact is shown in parenthesis.

TABLE 2

| Sample Number | Value of x $Sr_{2-x}Ba_xFe_yMo_zO_6$ | Value of y/z | Rate of Change in Magnetic Impedance (%) at 1000 G | at 500 G | Ferromagnetic Transition Temperature Tc (° C.) |
|---|---|---|---|---|---|
| 13 | 1 | 0.85 | 78 | 8 | 115 |
| 14 | 1 | 0.9 | 77 | 26 | 125 |
| 15 | 1 | 0.95 | 81 | 32 | — |
| 16(4) | 1 | 1 | 84 | 25 | 132 |
| 17 | 1 | 1.05 | 82 | 35 | — |
| 18 | 1 | 1.1 | 88 | 27 | 122 |
| 19 | 1 | 1.15 | 78 | 10 | 117 |
| 20 | 1.2 | 0.85 | 65 | 11 | 109 |
| 21 | 1.2 | 0.9 | 79 | 31 | 125 |
| 22(5) | 1.2 | 1 | 85 | 24 | 125 |
| 23 | 1.2 | 1.1 | 80 | 30 | 105 |
| 24 | 1.2 | 1.15 | 82 | 7 | 101 |
| 25 | 1.5 | 0.85 | 77 | 5 | 100 |
| 26 | 1.5 | 0.9 | 81 | 29 | 105 |
| 27(7) | 1.5 | 1 | 81 | 22 | 109 |
| 28 | 1.5 | 1.1 | 80 | 27 | 108 |
| 29 | 1.5 | 1.15 | 82 | 9 | 98 |
| 30 | 1.6 | 0.85 | 84 | 10 | 84 |
| 31 | 1.6 | 0.9 | 90 | 30 | 90 |
| 32(8) | 1.6 | 1 | 85 | 26 | 102 |
| 33 | 1.6 | 1.1 | 92 | 32 | 100 |
| 34 | 1.6 | 1.15 | 81 | 10 | 91 |
| 35 | 1.7 | 0.85 | 87 | 11 | 79 |
| 36 | 1.7 | 0.9 | 88 | 36 | 85 |
| 37 | 1.7 | 0.95 | 91 | 41 | — |
| 38(9) | 1.7 | 1 | 88 | 33 | 89 |
| 39 | 1.7 | 1.05 | 88 | 39 | — |
| 40 | 1.7 | 1.1 | 79 | 35 | 86 |
| 41 | 1.7 | 1.15 | 81 | 8 | 77 |

As is clear from Table 2, a Fe/Mo ratio (y/z) has no influence on the rate of MI change in a magnetic field of 1000 G when 1.0≤x≤1.7, but it has a large influence on the rate of MI change in a magnetic field of 500 G. In a range of 0.9≤y/z≤1.1, the rate of MI change in a magnetic field of 500 G is also 20% or more. However, it is seen that the rate of MI change is decreased outside the range of 0.9≤y/z≤1.1, as compared with the samples within the range of 0.9≤y/z≤1.1. Although the cause for these results is not established, it has been demonstrated from powder X-ray diffraction that the Fe/Mo ratio outside a range of 0.9≤y/z≤1.1 forms impurities such as $SrFeO_3$ and $SrMoO_4$, and the segregation of the impurities at grain boundaries is presumed to increase the resistances of the samples themselves, and thus decrease the responsivity to the low magnetic field.

The change in impedance at higher frequencies, which is observed in the case of the elements according to the present invention, is mainly attributed to the change in inductor component.

In the case of ferromagnet with $Z=R+j\omega L+1/j\omega C$, the inductor (L) component is proportional to the magnetic permeability, and the magnetic impedance effect is developed by a change in the magnetic permeability in the magnetic field. However, as is clear from this formula, the resistance (R) component has no frequency dependence, and thus has no influence in a high-frequency region when the resistance (R) component is sufficiently low, as in the case of metals. However, when the Fe/Mo ratio is excessively high or low, it is considered that a segregated layer increases the resistance, thus increasing the R contribution, with the result that the change in inductance (L) is apparently reduced to reduce the rate of change in impedance.

Example 2

Next, examination was carried out on the influence of sample formation on magnetic impedance characteristics using the same composition as sample number 7 demonstrated in Example 1 for the ceramic composition. Raw materials and green sheets were prepared in accordance with the same method as in Example 1, the sheets were stacked and subjected to processing so as to provide the length L, the width W, and the thickness T shown in Table 3 after firing, and terminal electrodes were formed after the firing to obtain samples. In the present example, the L/T was varied by varying the T with a fixed L: 2.0 mm and W: 1.2 mm. The samples were evaluated in accordance with the same method as in Example 1. The results are shown in Table 3.

TABLE 3

| Sample Number | Element Shape L/T ratio | Rate of Change in Magnetic Impedance (%) at 1000 G | at 500 G |
| --- | --- | --- | --- |
| 42 | 1 | 78 | 11 |
| 43 | 1.5 | 80 | 21 |
| 44 | 2.5 | 81 | 22 |
| 45 | 10 | 82 | 35 |

As is clear from Table 3, the L/T ratio has a large influence on the magnetic impedance characteristics, and as long as the L/T ratio is 1.5 or more, high rates of change can be achieved (as in an object of the present invention) in the wide range from the low magnetic field to the high magnetic field. However, when the L/T is less than 1.5, the responsivity to the low magnetic field is decreased compared with samples with the L/T of 1.5 or more. This is considered to be because, under the influence of a demagnetization field generated within a magnet when a magnetic field is applied to the magnet, the magnetic field was changed by the sample shape effectively for the magnet, and the rate of change in the low magnetic field was decreased in the case of the sample with the small L/T, which increases the demagnetization field. In order to make full use of characteristics of the material composition according to the present invention, it is also necessary to pay sufficient attention to the sample shape, and larger of L/T and L/W is preferably 1.5 or more. On the other hand, an excessively increased L/T or L/W will cause the mechanical strength to fall to an extremely low level, or cause an increase in element resistance. Depending on the composition, the L/T or L/W is desirably approximately 20 or less.

Example 3

An examination was carried out on the effect of a two-terminal sample in the form of a single plate in which a conductor was inserted for causing a short circuit between the two terminal electrodes. This sample is shown by the structure in FIG. 2. As in the case of the samples in Example 2, a ceramic with the same composition as sample number 7 in Example 1 was selected to prepare samples in accordance with the same method as in Example 1. In the process of pressure bonding of sheets, a through conductor 4 for causing the short circuit between the two external electrode terminals was inserted to prepare samples which had the dimensions of length L: 2 mm, width W: 1.0 mm, and thickness T: 0.8 mm. Evaluation was carried out for 30 samples prepared for each of with and without the through conductor in accordance with the same method as in Example 1 to calculate the rate of change in magnetic impedance in a magnetic field of 500 G. The results are shown in FIG. 6.

Figure 6:
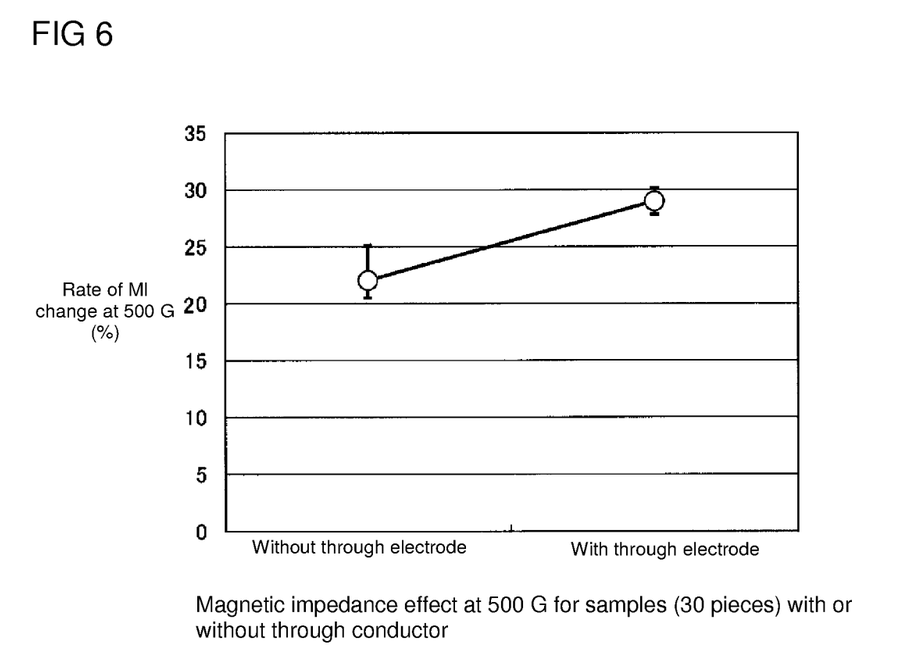
FIG. 6 is a graph showing the relationship between with and without a through conductor and the rate of MI change in a magnetic field of 500 G.

As is clear from FIG. 6, even the samples without the through conductor all can achieve rates of change of 15% or more, but there is considerable variation. This variation is presumed to be caused by the influences of the capacitance component and resistance component at polycrystalline grain boundaries, which are likely to be inhomogeneous. In addition, it is known that signals are concentrated on a surface layer with an increase in frequency (skin effect), and there is thus considered the possibility of being affected by the microstructure of the surface which is likely to have a relatively inhomogeneous grain size distribution, by a surface layer altered by firing for a reduction treatment, etc. On the other hand, the samples with the through conductor formed have slightly improved rates of change in magnetic impedance in the low magnetic field, and also have reduced variation. Although the cause of this effect is not established, it is presumed that, the through conductor reduces the inhomogeneity characteristic of the ceramic because a low resistive body is connected in parallel to the SMFO based ceramic body in response to the magnetic field.

Figure 7:
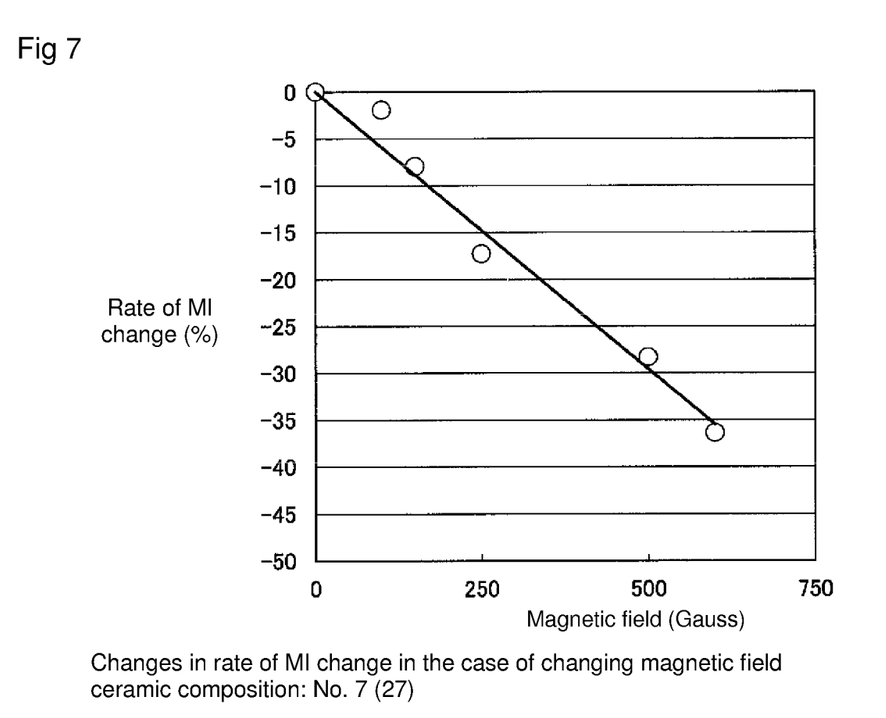
FIG. 7 is a graph showing changes in the rate of MI change for sample number 7 in the case of changing the magnetic field.

FIG. 7 is a graph showing changes in the rate of MI change (magnetoimpedance effect) for sample number 7 in the case of changing the magnetic field. The vertical axis indicates the rate of MI change in the case of changing the magnetic field at a frequency of 10 MHz. It is to be noted that the measurement results in FIGS. 4 through 7 show results at room temperature.

The embodiments and examples disclosed herein are all to be considered by way of example in all respects, but not limiting. The scope of the present invention is defined by the claims, but not by the description above, and intended to encompass all modifications within the spirit and scope equivalent to the claims.

DESCRIPTION OF REFERENCE SYMBOLS 1,2 terminal electrodes
3 ceramic body
4 through conductor

The invention claimed is:
1. A magnetic impedance element comprising a ceramic body represented by the formula $Sr_{2-x}Ba_xFe_yMo_zO_6$ in which $0.8 \leq x \leq 2.0$, each of y and z is greater than 0, and $y+z=2$, and at least two external electrode terminals disposed on the ceramic body, having a rate of change in magnetic impedance at magnetic field of 1000 G of 65% or more.

2. The magnetic impedance element according to claim 1, wherein 0.8≤x≤1.7.

3. The magnetic impedance element according to claim 2, wherein 0.9≤y/z≤1.1.

4. The magnetic impedance element according to claim 3, wherein y/z is not 1.

5. The magnetic impedance element according to claim 4, wherein the larger of (a) the ratio (L/T) of the ceramic body length L to thickness T and (b) the ratio (L/W) of the length L to width W, is 1.5 or more.

6. The magnetic impedance element according to claim 5, further comprising a conductor disposed between and in electrical contact with the at least two external electrode terminals.

7. A magnetic sensor comprising the magnetic impedance element according to claim 4.

8. The magnetic impedance element according to claim 3, wherein the larger of (a) the ratio (L/T) of the ceramic body length L to thickness T and (b) the ratio (L/W) of the length L to width W, is 1.5 or more.

9. The magnetic impedance element according to claim 8, further comprising a conductor disposed between and in electrical contact with the at least two external electrode terminals.

10. A magnetic sensor comprising the magnetic impedance element according to claim 3.

11. The magnetic impedance element according to claim 2, wherein the larger of (a) the ratio (L/T) of the ceramic body length L to thickness T and (b) the ratio (L/W) of the length L to width W, is 1.5 or more.

12. The magnetic impedance element according to claim 11, further comprising a conductor disposed between and in electrical contact with the at least two external electrode terminals.

13. A magnetic sensor comprising the magnetic impedance element according to claim 2.

14. The magnetic impedance element according to claim 1, wherein the larger of (a) the ratio (L/T) of the ceramic body length L to thickness T and (b) the ratio (L/W) of the length L to width W, is 1.5 or more.

15. The magnetic impedance element according to claim 14, further comprising a conductor disposed between and in electrical contact with the at least two external electrode terminals.

16. A magnetic sensor comprising the magnetic impedance element according to claim 15.

17. A magnetic sensor comprising the magnetic impedance element according to claim 14.

18. The magnetic impedance element according to claim 1, further comprising a conductor disposed between and in electrical contact with the at least two external electrode terminals.

19. A magnetic sensor comprising the magnetic impedance element according to claim 18.

20. A magnetic sensor comprising the magnetic impedance element according to claim 1.

* * * * *